United States Patent [19]

Whiting et al.

[11] Patent Number: 4,930,142
[45] Date of Patent: May 29, 1990

[54] DIGITAL PHASE LOCK LOOP

[75] Inventors: Douglas L. Whiting, South Pasadena; Glen A. George, Pasadena, both of Calif.

[73] Assignee: STAC, Inc., Pasadena, Calif.

[21] Appl. No.: 281,305

[22] Filed: Dec. 6, 1988

[51] Int. Cl.[5] ............................................. H03D 3/20
[52] U.S. Cl. ..................................... 375/120; 375/82; 331/1 A
[58] Field of Search ..................... 375/81, 82, 97, 106, 375/120, 119; 307/527; 331/1 A, 1 R, 25; 455/180, 260

[56] References Cited

U.S. PATENT DOCUMENTS

| | | | |
|---|---|---|---|
| 4,145,667 | 3/1979 | Messerschmidt | 331/16 |
| 4,360,926 | 11/1982 | Hedin et al. | 375/120 |
| 4,419,760 | 12/1983 | Bjornholt | 375/120 |
| 4,519,086 | 5/1985 | Hull et al. | 375/120 |
| 4,590,602 | 5/1986 | Wohaver | 375/82 |
| 4,633,193 | 12/1986 | Scordo | 331/1 A |
| 4,667,170 | 5/1987 | Lofgren et al. | 331/17 |
| 4,712,223 | 12/1987 | Nelson | 377/43 |
| 4,716,383 | 12/1987 | Lofgren et al. | 331/117 |
| 4,802,009 | 1/1989 | Hartmeir | 331/25 |
| 4,811,424 | 3/1989 | Cox | 375/120 |
| 4,815,102 | 3/1989 | Roza | 375/120 |

FOREIGN PATENT DOCUMENTS

| | | |
|---|---|---|
| 0157053 | 12/1987 | European Pat. Off. . |
| 62-298227 | 12/1987 | Japan . |
| 8800733 | 1/1988 | PCT Int'l Appl. . |
| 2197553 | 5/1988 | United Kingdom . |

Primary Examiner—Robert L. Griffin
Assistant Examiner—Stephen Chin
Attorney, Agent, or Firm—Irell & Manella

[57] ABSTRACT

An apparatus and/or method for generating a digital clock signal which is frequency and phase referenced to an external digital data signal is disclosed. The external digital data signal is typically subject to variations in data frequency and high frequency jitter unrelated to changes in the data frequency.

14 Claims, 4 Drawing Sheets

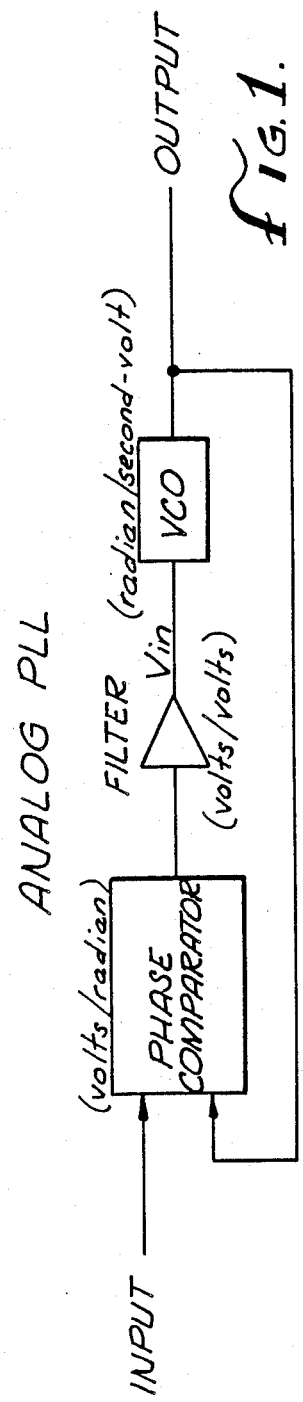
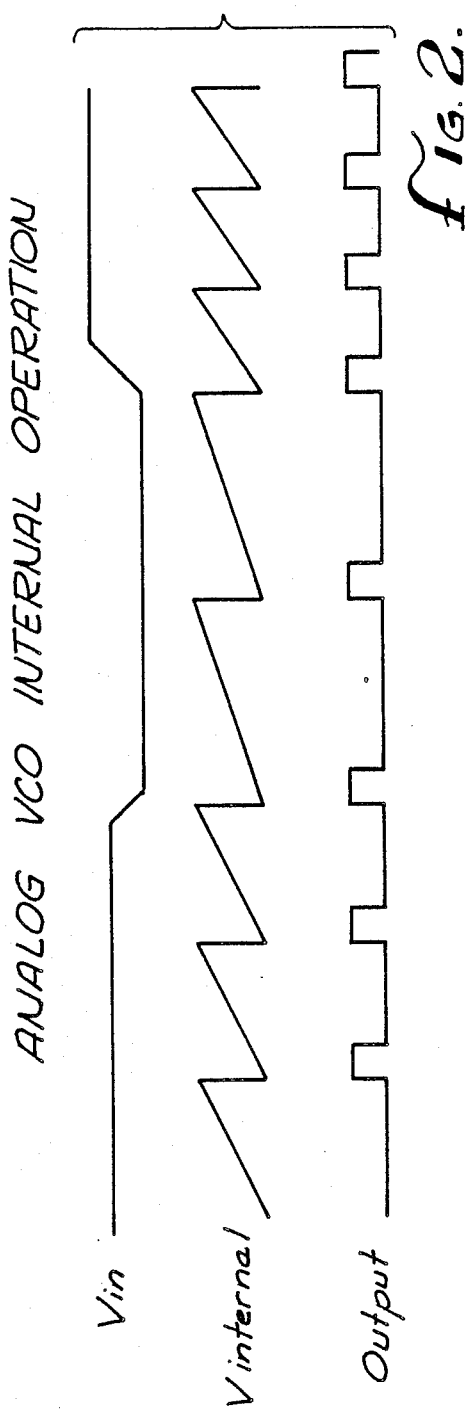
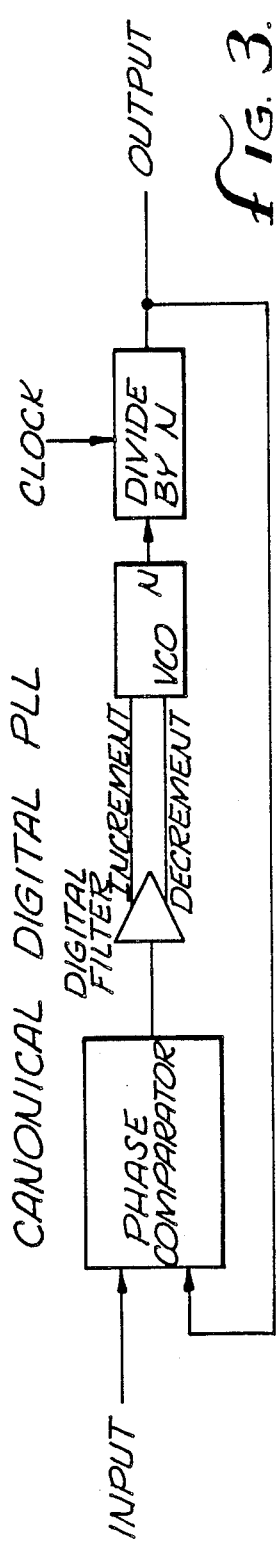

DIGITAL PHASE LOCK LOOP

FIELD OF THE INVENTION

The present invention relates to phase lock loop system and, more particularly, to digital phase lock loop systems. Phase lock loops are employed to generate a clock signal which is frequency and/or phase referenced to an external input signal. Phase lock loop systems are used in many fields of communications and are also employed in computer applications of data synchronization from external sources. The present invention is particularly directed to the use of digital phase lock loops for data separation in tape or disk drive systems when reading data information which is interspersed with clock information.

BACKGROUND OF THE INVENTION

Broadly, a phase lock loop is considered to be a kind of filter that passes signals and rejects noise. Gardner, "Phase Lock Techniques," *John Marley & Sons* (New York, 1979). Stated differently, the task of the phase lock loop is typically to reproduce an original signal while removing as much noise present in the signal as possible. To reproduce the signal, the phase lock loop makes use of a local oscillator, typically a voltage controlled oscillator (VCO), whose frequency is very close to that of the expected signal. The VCO output and incoming signal waveforms are compared with one another by a phase detector whose output indicates instantaneous phase difference (i.e. phase error). In order to suppress noise, the error is averaged over some length of time, and the average is used to establish the frequency of the oscillator.

If the original signal is well behaved (stable in frequency), the VCO will need little information to be able to track the input signal, and that information can be obtained by averaging for a long period of time, thereby eliminating noise that could be very large.

In data storage or communication systems, data is written using various modulation schemes. On the reading end, a receiver is responsible for recovering the data and clock (demodulation). Phase lock loops are used to lock onto the incoming data and allow separation of data and clock. As shown in FIG. 1, a typical phase lock loop is an analog system which has a VCO whose input is driven by the output of a filter of the measured phase error. The VCO can abjust frequency to match the incoming data frequency, which may vary in data storage systems due to speed variations in the head to media motion. In addition to matching the incoming frequency, the VCO will adjust its phase to match the phase on the incoming data until there is no difference ideally between the VCO output and the incoming data. The filter gain and characteristics are chosen to ensure that the VCO output will "lock" onto the input signal over a reasonable frequency range. The phase comparator may be an analog circuit, or in the case of digital communications or storage, it is typically a small digital logic circuit.

As shown in FIG. 1 the units of gain for each function in the loop are indicated. Note, particularly, that the phase detector converts phase to voltage and that the VCO converts voltage to the time derivative of phase (i.e., frequency). This has the important consequence that the VCO is actually an integrator; a fixed input voltage error produces a linearly rising phase error at the VCO output. Also, note that if the VCO frequency matches the incoming signal frequency, but there is a phase difference, the phase comparator and filter will force the VCO to go out of frequency, lock momentarily until phase lock is achieved, after which the frequency will return to lock. This process may degrade performance, especially in situations wherer phase difference occurs frequently.

The analog version of the VCO may consist of a capacitor that charges up to a threshold voltage at a variable rate depending on the input voltage ($V^{in}$). See FIG. 2. When the voltage reaches the threshold voltage level in the capacitor, the capacitor discharges, a pulse is output, and the charging up process begins over again. The higher the input voltage ($V^{in}$), the faster the capacitor charges ("ramps up") and the more frequently pulses are output. Similarly, the lower the input voltage ($V^{in}$), the slower the capacitor charges and the less frequently pulses are output from the phase lock loop. The resolution for an analog VCO is quite high and the frequency can easily be set to within 0.1% or better in most cases.

Many digital phase lock loops have been designed in the past, and they typically have a block diagram similar to the one shown in FIG. 3. A divide by N counter has been added between the VCO output and the phase detector. The divider may be implemented as a couter or as a shift register with variable taps to set its length. The divider in the phase lock loop outputs a pulse every N clocks, and the phase comparator measures whether the output pulses lead or lag the input pulses. This measure is quantized (ofter to a single bit—indicating lead or lag) and this quantized phase error is input to the digital filter.

The complexity of the filter varies depending on the amount of jitter and frequency variation expected. The output of the digital filter consists typically of two control signals, one which increments N (i.e., slows down the divider) and one which decrements N (i.e., speeds up the divider). The nominal value of N is set by the expected number of clocks per unit time. Unless N is extremely large, the frequency resolution of this type of system is very coarse and it is impossible to lock frequency to an accuracy better than 1/N. To avoid this problem (i.e., to make N large) requires a very high clock rate which may not be feasible.

SUMMARY OF THE INVENTION

The present invention seeks to provide a method and apparatus that reduces or eliminates the disadvantages referred to above.

Briefly, a preferred embodiment of the invention includes an apparatus and/or method for generating a digital clock signal which is frequency and phase referenced to an external digital data signal. The phase of the digital data signal is initialized to a phase lock point arbitrarily determined, and the slope of the digital clock signal is initialized to a desired initial slope value. The external digital data signal is typically subject to variations in data frequency and high frequency jitter unrelated to changes in the data frequency. In the preferred embodiment of the invention, the digital clock signal is generated through the following steps.

For each clock cycle of the digital clock signal, the value of the slope is added t the value of phase to obtain an uncompensated value for phase. Then, a clock pulse is generated when the uncompensated value of phase is greater than or equal to a predetermined value. The value of phase is also reinitialized by subtracting said predetermined value from the value of phase. The external digital data signal is then monitored for a pulse of digital data.

When a pulse of digital data is detected, the phase lock point is subtracted from the value for phase. The phase error is filtered in order to generate a phase correction value. The phase correction value is added to the uncompensated phase value to obtain a compensated phase value. The difference between successive phase errors is determined in order an uncompensated value of slope error. The slope error is then filtered in order to generate a slope correction value and the slope correction value is added to the slope in order to obtain a compensated slope value. The compensated slope value is added to the compensated phase value to obtain a new phase value and the new phase value becomes the starting phase value for the next clock cycle. In this way, the phase and/or the slope are compensated in order to generate a digital clock signal which closely references the external digital signal.

BRIEF DESCRIPTION OF THE DRAWINGS

FIG. 1 depicts a block diagram of a prior art analog phase lock loop;

FIG. 2 represents the operation of a prior art analog VCO;

FIG. 3 is a second block diagram of a prior digital phase lock loop;

DETAILED DESCRIPTION

Figure 4A:
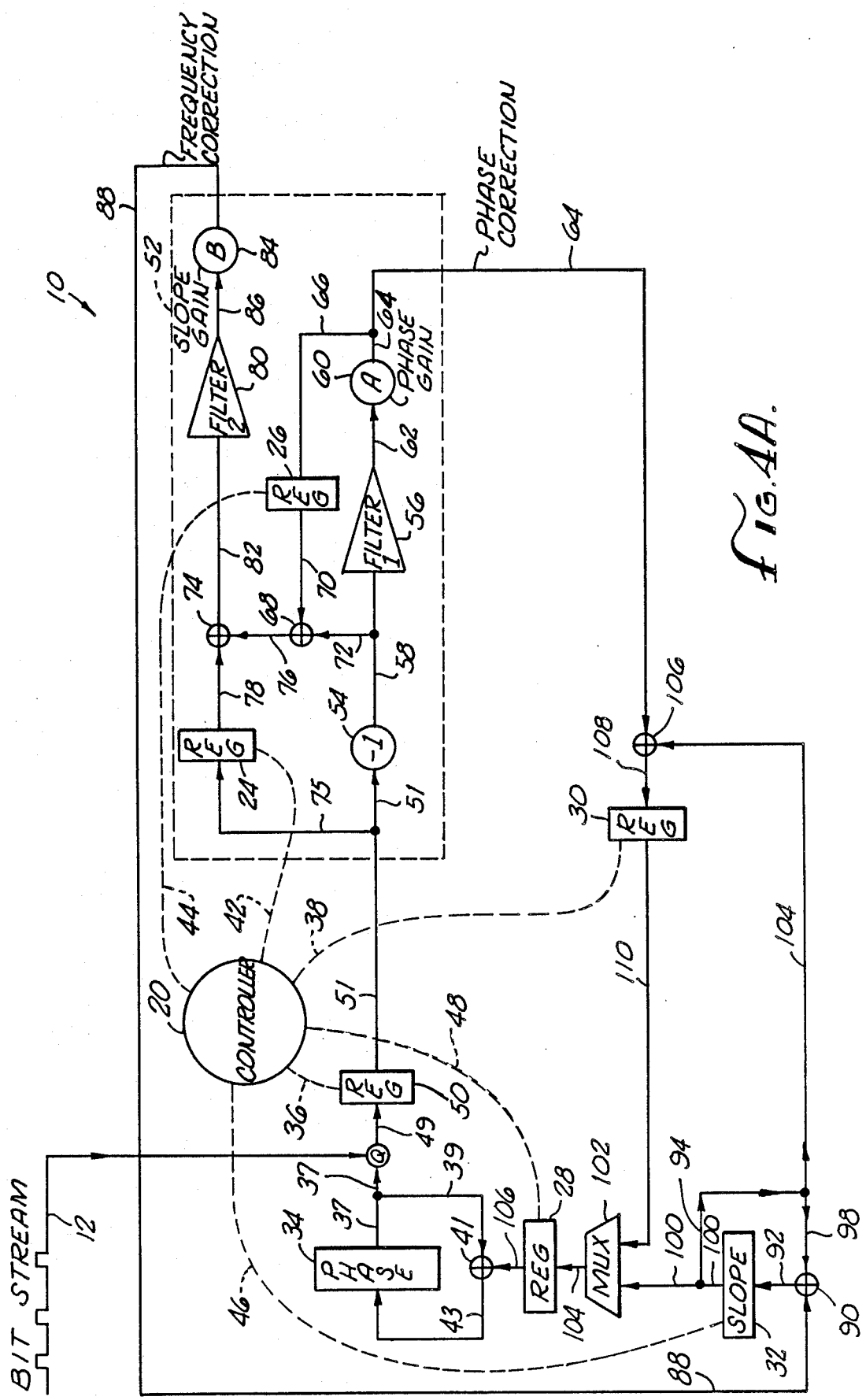
FIG. 4A depicts a digital phase lock loop in accordance with the present invention.

Referring to FIG. 4(a), a circuit diagram 10 which incorporates the preferred embodiment of the digital phase lock loop is shown. The elements of circuit 10 are implemented by digital logic. Circuit 10 is controlled by controller 20. Controller 20 is linked to a plurality of registers 22, 24, 26, 28, 30, 32, 34 by control lines 36, 38, 40, 42, 44, 46, 48. Each register temporarily holds digital information for further processing. An internal clock, which in the preferred embodiment operates at 30 megahertz, determines the activity level of the controller 20, which may affect one or more registers 22, 24, 26, 28, 30, 32, 34 during any clock cycle.

Referring to the FIG. 4(A) a detailed discussion of the circuit organization is now presented. A detailed discussion regarding the operation and timing sequence of the various components will be presented shortly with reference to the flow diagram of FIG. 5. Input data stream 12 is received at quantizer 48 where the phase of the input data stream is compared with the previously calculated phase output of phase register 34. The phase error detected at quantizer 48 is then sent via line 49 to register 50. The phase error stored at register 50 represents an uncompensated phase error. Register 50 is coupled via line 51 to the filter 52 which contains both phase and frequency filters. Filter 52 generates both frequency and phase correction signals.

The output of register 50 is input via line 51 to filter 52 and specifically to multiplier 54. Multiplier 54 multiplies the uncompensated phase error (output of register 50) by a negative 1 and the output of multiplier 54 is coupled to filter 56 via line 58. Filter 56 smooths the detected phase error and the output of filter 56 is multiplied by a constant A at multiplier 60 which is coupled to filter 56 via line 62. In the preferred embodiment, constant A of multiplier 60 can be variably set by the user of circuit 10. The output of multiplier 60 is the phase correction signal and it is output over line 64 to line 66 which is coupled to register 26. Register 26 stores the phase correction until it is properly output to adder 68 over line 70. Adder 68 is also coupled to line 72 which is coupled to line 58. Recall that line 58 contains the uncompensated phase error signal multiplied by negative 1 at multiplier 54. The inputs to adder 68 are the previously stored phase correction signal and the uncompensated phase error currently sent over line 58. The output of adder 68 is equal to the old phase error which is coupled with adder 74 via line 76. The adder 74 adds the old phase error with the phase error currently stored in register 24. Register 24 is coupled to the uncompensated phase error register 50 via lines 61 and 75. Register 24 is coupled to adder 74 via line 78. The output of adder 74 is the slope error which is equal to phase error less old phase error. The output of adder 74 is coupled to filter 80 via line 82. Filter 80 smooths the slope error signal calculated and output at adder 74. The output of filter 80 is coupled to multiplier 84 via line 86. The output multiplier 84 is the slope correction signal. The output of 84 is sent via line 88 to adder 90. Adder 90 adds the slope correction input with the current slope modified by the previous slope correction which is input via line 98. The output of adder 90 is input to register 32 via line 92. Register 32 will always contain the most current slope and will be adjusted once for each input pulse by the slope correction value. The output of register 32 is sent via line 100 to multiplexer 102. Additionally, the corrected slope is fed back via lines 94 and 98 to adder 90. At the same time, the current slope is sent via lines 94 and 104 to adder 106. At adder 106 the phase correction signal arriving over line 64 is added to the corrected slope signal arriving over line 104. The output of this calculation at adder 106 is input to register 30 via line 108.

The output of register 30 is input to multiplexer 102 via line 110. Multiplexer 102 arbitrates the input of either slope (over line 100) or slope plus phase correction (over line 110) into register 28 via line 104. The slope or slope plus phase correction stored at register 28 is then input into the phase generator loop 37, 39, 41, 43, 34, via line 106. The slope or slope plus phase correction over line 106 is added to the most recently calculated phase over line 39 at adder 41. The output of adder 41 is the corrected phase and it is input to the phase register 34 via line 43. The output of the phase register 34 is input into quantizer 48 via line 37. As stated earlier, quantizer 48 determines the difference in the input phase with the generated phase and accepts the input data stream 12. The process discussed above continues until there is no more input data stream to process.

Figure 4B:
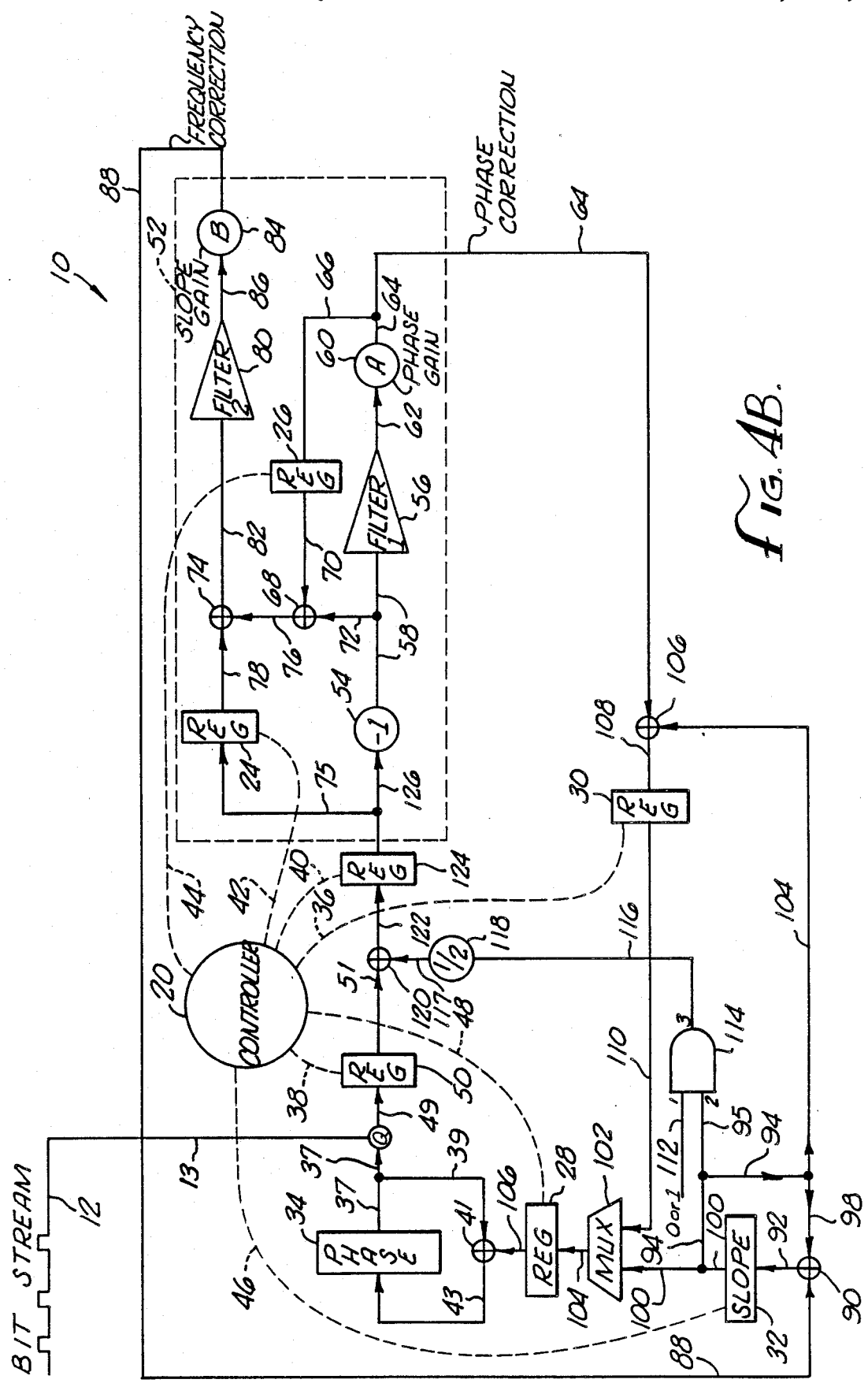
FIG. 4b depicts a digital phase lock loop which is an alternate embodiment of the present invention.

FIG. 4(b) represents an altenate embodiment of the digital phase lock loop shown in FIG. 4(a). The operational difference of circuit 10 of FIG. 4(A) from circuit 10 of FIG. 4(b) is that the circuit of FIG. 4(b) effectively samples phase error at twice the clock rate. The circuit of FIG.4(b) contains a few additional components, namely, a multiplier 114, a second multiplier 118, an adder 120, and a storage register 124. Additionally, quantizer 48 performs an additional determination for whether the clock is on the rising or falling edge when a clock pulse occurs. The purpose of this arrangement is for more accurately representing the phase error by achieving twice the effective resolution at the same clock rate.

More particularly, quantizer 48 monitors the clock cycle. In the preferred embodiment, when input pulse is first detected on the falling edge of the clock, adder 114 multiplies the slope calculated and stored at register 32 by zero. However, when the pulse is detected on the rising edge of the clock, adder 114 multiplies the slope input by 1. The slope is then sent over line 116 to multiplier 118 where it is multiplied by ½. The resulting calculation is then input to adder 120 via line 117. This value of the slope is then added to the phase erro currently stored in register 50 and sent to the adder 120 via line 51. The result is then sent to register 124 via line 122. The output of register 124 is sent to the filter arrangement 52 which calculates the slope correction and phase correction in the same manner as discussed earlier with regard to FIG. 4(a). The resulting phase error is the same as would have been composed by the circuit of FIG. 4(a) at twice the clock frequency.

Figure 5:
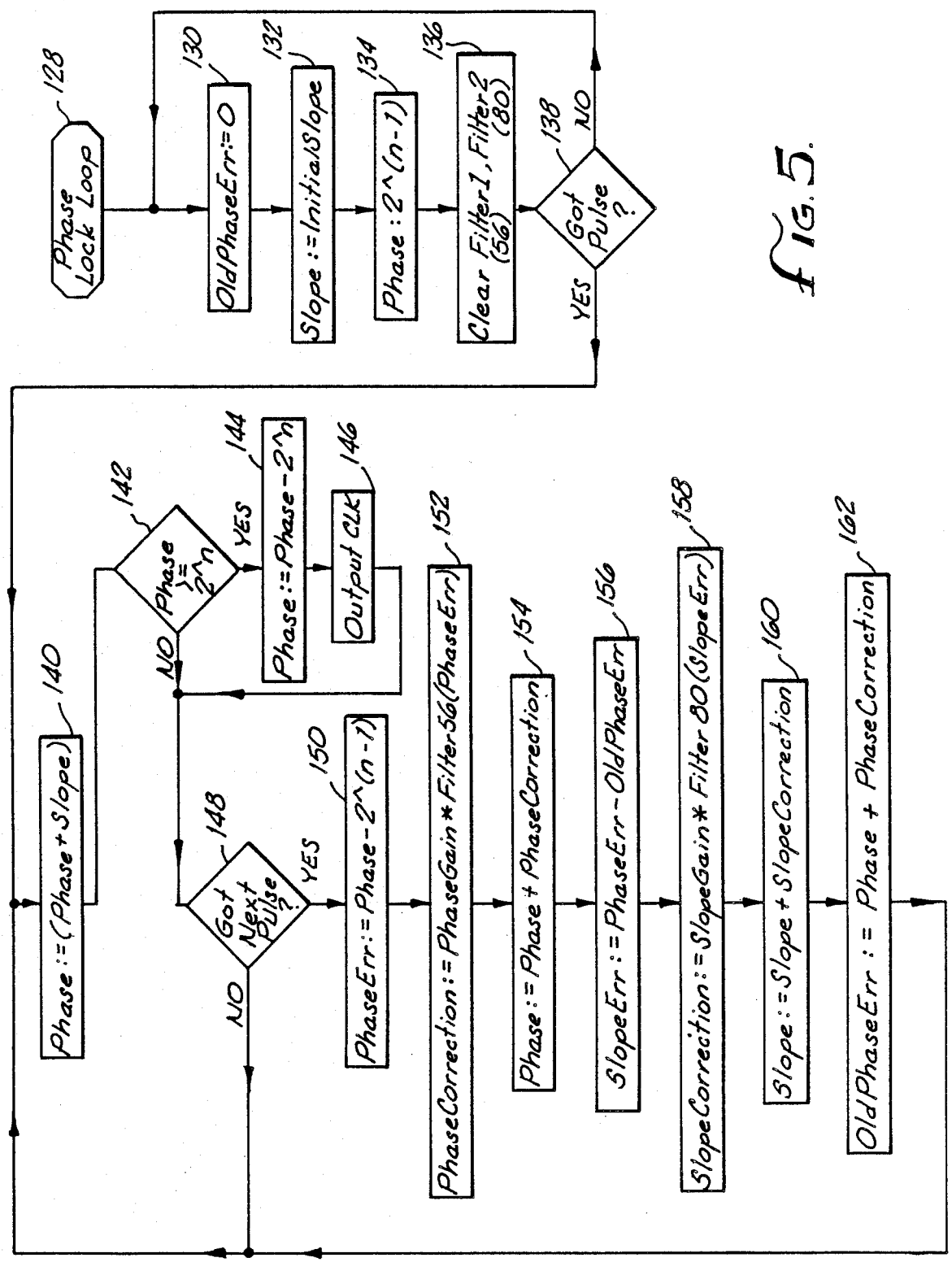
FIG. 5 is a flow block diagram depicting the steps preferred by the circuits shown in FIGS. 4a and 4b.

Referring to FIG. 5, a flow block diagram representing the order of operation of the hardwired circuitry of both FIGS. 4(i a) and (b) is now discussed. More particularly, FIG. 5 shows the decision making process that coordinates the folw of data through the circuit (FIGS. 4(a) and 4(b)). Initialization occurs at blocks 130, 132, 134 and 136. Specifically, a variable called old phase error is set equal to 0 during block 130. Then during block 132, a variable SLOPE is set equal to the value of initial slope which is generally set to 0. During block 134, a variable PHASE is set equal to $2^{(n-1)}$ or $2^n/2$. In this way, the Phase is initialized to the center or midpoint of the expected pulse interval. At block 136, Filter 1 (56, FIGS. 4(a) and 4(b)), and Filter 2 (80, FIGS. 4(a) and 4(b)), are cleared.

At decision block 138, a determination is made on whether any pulses have arrived. More particularly, the system checks to determine if a preamble of data signifying that the first bit of data is about to be processed has occurred. If there is no pulse, then processing continues at blocks 130, 132, 134, 136 until a pulse is obtained. Assuming that the first pulse is obtained, processing continues at block 140. During block 140, the current value of PHASE is added to the current value of SLOPE. Then at block 142, a determination is made on whether PHASE is greater than or equal to $2^n$. Assuming that the phase is not greater than or equal to $2^n$, processing continues at decision block 148, during which a determination is made on whether the next pulse of data has occurred. Assuming that the next pulse of data has not arrived, then processing continues at blocks 140, 142 and 148. Graphically, a sawtooth function is generated as processing loops around blocks 140, 142 and 148. Eventually, PHASE will be equal to or greater than $2^n$. When this situation occurs, processing continues at block 144. During block 144, PHASE is set equal to PHASE-$2^n$. This operation essentially resets or wraps the PHASE back to the original starting point. At block 146, a single clock pulse is output. Processing continues at block 148, during which a determination is made on whether the next pulse of data has not arrived. Assuming that the next pulse of data has not arrived, then processing continues at vlocks 140, 142, 144, 146 and 148. In the preferred embodiment, there are 10 clock pulses for each pulse of data. If the circuit were implemented by the altenate circuit shown in FIG. 4(b), there would still be 10 clock pulses, however, there would be twice as many samples of phase error taken for each pulse; 20 samples for each clock pulse.

Once a data pulse is obtained at block 148, processing continues at block 150. During block 150, the phase error is calculated by determining PHASE-$2^{(n-1)}$. Assuming that the clock pulses are in Phase, then PHASE-$2^{(n-1)}$ will be zero which is equivalent to no phase error. However, due to noise, a shift in phase and frequency may have occurred causing the clock pulses to be out of sync with the data pulse, and therefore generating a phase error during block 150. If the calculated phase error is positive then the clock pulse leads the data pulse whereas, if the phase error is negative, then the clock pulse lags the data pulse.

Processing continues at block 152, during which the correction is determined by calculating of Phase Gain (60, FIGS. 4(a) and 4(b)) multiplied by output of Filter (56, FIGS. 4(a) and 4(b)). This operation effectively dampens the magnitude of the Phase correction. Stated differently, the phase gain 60 and filter 56 together smooth out the Phase correction values. During block 154, the value of phase correction is added to the present value of Phase. This step acts as a one time Phase correction.

During block 156, slope error is calculated by determining the difference in the value of the phase error and the old phase error. Because the value for phase error will drift significantly when there is an error in the frequency, the difference in the current phase error and the previous phase error will be proportional to the frequency error or the value in scope. The calculation for old phase error is calculated at block 162 which will be discussed shortly.

At block 158 the value of the slope correction is determined by calculating slope gain (84, FIGS. 4(a) and 4(b)) multiplied by the output of Filter 80 (FIGS. 4(a) and 4(b)). This calculation actually affects the incline or decline of the ramp function which is generated at block 140. The greater the slope correction, the more drastic the affect will be on the ramp function.

At block 160 the slope correction is added to the prior value of SLOPE, and at block 162 the value for old phase error is determined. The old phase error is determined by adding the value of the current phase error to the value of the current phase correction. The purpose of this step is to separate the effect of the phase correction from the calculation of the slope error. For example, if phase error is lagging and therefore negative, the phase correction would be a smaller positive value and thus the effect of the phase correction would be built into the old phase error. When the slope error is calculated again at block 156, the difference between the current phase error and the old phase error will be caused by variations in frequency and not by phase. In situations where only phase is out of sync and frequency is on sync and a phase correction has been made, then during the next data pulse if the phase error is 0, the calculation in current phase error less old phase error will also be zero and not affect the slope error.

The invention has been described in an exemplary and preferred embodiment, but it is not limited thereto. Those skilled in the art will recognize that a number of additional modifications and improvements can be made to the invention without departure from the essential spirit and scope. The scope of the invention should only be limited by the following claims.

What is claimed is:

1. A method for generating a digital clock signal which is frequency and phase referenced to an external digital data signal, the phase of said digital data signal initialized to a phase lock point arbitrarily determined, the slope of said digital clock signal initialized to a desired initial slope value, said external digital data signal subject ot variations in data frequency and high frequency jitter unrelated to changes in said data frequency, said method comprising the steps of:

for each clock cycle of said digital clock signal;

adding the value of slope of the clock signal to the value of phase of the digital data signal to obtain an uncompensated value of phase, generating a clock pulse when said uncompensated value of phase is greater than or equal to a predetermined value, and reinitializing the value of phase by subtracting said predetermined value from said value of phase, minitoring said external digital data signal for a pulse of said external digital data;

operative when said pulse of external digital data is detected, subtracting said phase lock point from the value of phase to determine phase error, filtering said phase error to generate a phase correction value, adding said phase correction value to said uncompensated phase value to obtain a compensated phase value, determining the difference between the phase error for the current clock cycle and the previous clock cycle to obtain an uncompensated value of slope error, filtering said slope error to generate a slope correction value, adding the slope correction value to the slope to obtain a compensated slope value, and adding the compensated slope value to the compensated phase value to obtain a new phase value, said new phase value being the starting phase value of the next clock cycle, whereby the phase and/or slope are compensated in order to generate a digital clock signal which closely references said external digital data signal.

2. The method of claim 1 wherein said step for filtering said phase error further includes the step of multiplying said filtering phase error by a constant value for determining said phase correction value.

3. The method of claim 2 wherein said step further includes the step of adjusting said constant value.

4. The method of claim 1 wherein said step for filtering said slope error further includes the step of multiplying said filter slope error by a constant value for determining said slope correction value.

5. The method of claim 4 wherein said step for filtering further includes the step of adjusting said constant value.

6. The method of claim 1 further including the step of:

operative when said pulse of digital data is detected, determining whether said pulse was detected on the rising or falling edge of said digital clock signal.

7. The method of claim 6 wherein said step for subtracting the phase lock point from the phase to determine phase error, further including the steps of:

operative when said pulse is detected on the rising edge of said clock, multiplying said slope by one half to produce a phase error adjustment value and adding said phase error adjustment value to said error, whereby the phase error sampling rate is effectively doubled.

8. A apparatus for generating a digital clock signal which is frequency and phase referenced to an external digital data signal, the phase of said digital data signal initialized to a phase lock point arbitrarily determined, the slope of said digital clock signal initialized to a desired initial slope value, said external digital data signal subject to variations in data frequency and high frequency jitter unrelated to changes in said data frequency, said apparatus comprising:

means for adding the value of slope of the clock signal to the value of phase of the digital data signal to obtain an uncompensated value of phase, means for generating a clock pulse when said uncompensated value of phase is greater than or equal to a predetermined value, and means for reinitializing the value of phase by subtracting said predetermined value from said value of phase means form monitoring said external digital data signal for a pulse of said external digital data;

means for subtracting said phase lock point from said value of phase to determine phase error, means for filtering said phase error to generate a phase correction value, means for adding said phase correction value to said uncompensated phase value to obtain a compensated phase value, means for determining the difference between the phase error for the current clock cycle and the previous clock cycle to obtain an uncompensated value of slope error, means for filtering said slope error to generate a slope correction value, means for adding the slope correction value to the slope to obtain a compensated slope value, and means for adding the compensated slope value to the compensated phase value to obtain a new phase value, said new phase value being the starting phase value of the next clock cycle, whereby the phase and/or slope are compensated in order to generate a digital clock signal which closely references said external digital data signal.

9. The apparatus of claim 8 wherein said means for filtering said phase error further includes means for multiplying said filtered phase error by a constant value for determining said phase correction value.

10. The apparatus of claim 9 wherein said means further includes means for adjusting said constant value.

11. The apparatus of claim 10 wherein said means for filtering said slope error further includes means for multiplying said filter slope error by a constant value for determining said slope correction value.

12. The apparatus of claim 11 wherein said means for filtering further includes means for adjusting said constant value.

13. The apparatus of claim 8 further includes:

operative when said pulse of digital data is detected, means for determining whether said pulse was detected on the rising or falling edge of said digital clock signal.

14. The apparatus of claim 13 wherein said means for subtracting the phase lock point from the phase to determine phase error, further includes:

operative when said pulse is detected on the rising edge of said clock, means for multiplying said slope by one half to produce a phase error adjustment value and means for adding said phase error adjustment value to said phase error, whereby the phase error sampling rate is effectively doubled.

* * * * *

UNITED STATES PATENT AND TRADEMARK OFFICE
CERTIFICATE OF CORRECTION

PATENT NO. : 4,930,142

DATED : May 29, 1990

INVENTOR(S) : Douglas L. Whiting and Glen A. George

It is certified that error appears in the above-identified patent and that said Letters Patent is hereby corrected as shown below:

Col. 2, line 65, cancel "t" and insert --to--

Col. 3, line 11, after "order" and before "an" insert --to obtain--

Col. 5, line 13, cancel "erro" and insert --error--

Col. 5, line 24, cancel "(i a)" and insert --(a)--

Signed and Sealed this

Eighth Day of June, 1993

Attest:

MICHAEL K. KIRK

*Attesting Officer*     *Acting Commissioner of Patents and Trademarks*